US006267860B1

(12) United States Patent
Brodsky

(10) Patent No.: US 6,267,860 B1
(45) Date of Patent: Jul. 31, 2001

(54) METHOD AND APPARATUS FOR ELECTROPLATING

(75) Inventor: William Louis Brodsky, Binghamton, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/361,728

(22) Filed: Jul. 27, 1999

(51) Int. Cl.[7] .................................................. C25D 17/04
(52) U.S. Cl. .................. 205/96; 204/230.2; 204/297.06; 204/297.1; 204/297.13; 204/DIG. 7
(58) Field of Search .......................... 205/96; 204/230.2, 204/297.1, 297.06, 297.13, 297.15, DIG. 7

(56) References Cited

U.S. PATENT DOCUMENTS

| 3,531,392 | * | 9/1970 | Schmeiser ............................. 204/225 |
| 3,592,754 | | 7/1971 | Aihara ................................. 204/230.2 |
| 4,786,384 | | 11/1988 | Gerhardt et al. ....................... 205/758 |
| 4,828,654 | | 5/1989 | Reed ....................................... 205/97 |
| 5,024,732 | | 6/1991 | Hubel ..................................... 205/80 |
| 5,759,363 | * | 6/1998 | Rose .................................. 204/297.13 |

* cited by examiner

Primary Examiner—Kathryn Gorgos
Assistant Examiner—William T. Leader
(74) Attorney, Agent, or Firm—Connolly, Bove, Lodge & Hutz, LLP.; Lawrence R. Fraley, Esq.

(57) ABSTRACT

Electrolytic plating of a workpiece is enhanced by providing a resistor between the workpiece and electrically conductive support member.

19 Claims, 6 Drawing Sheets

METHOD AND APPARATUS FOR ELECTROPLATING

DESCRIPTION

TECHNICAL FIELD

The present invention relates to a method for enhancing the electroplating of an article and especially for electroplating of microelectronic and other precision components. The present invention is particularly concerned with improving the uniformity of plating thicknesses. Moreover, the present invention relates to electroplating apparatus capable of improving the uniformity of plating thicknesses.

BACKGROUND OF INVENTION

Electrolytic plating is widely used for plating of microelectronic and other precision articles. For example, electroplating is widely practiced in the printed circuit industry to add layers of various metals to other conductors. Copper may be plated to increase the thickness of conductors. Layers of nickel and gold are routinely added to copper for protection to prevent oxidation. A great variety of materials, thicknesses and layers are known in the electroplating art.

An important and major concern in electroplating is control of plated thickness distribution. It especially impacts the conventional pattern electroplating of circuits, on printed circuit boards or on semiconductors, where isolated circuits plate thicker than dense circuits.

Plating thickness is also related to the current distribution during the plating operation. Printed circuit or plated feature density also affects the uniformity of the plating in a given region.

One suggestion for improving thickness distribution has been pulse reverse plating. However, this involves significant investments in new rectifiers and cabling, and the use of different plating chemistries than when DC is used.

Attempts to minimize disparity in plating thicknesses have also involved changing the cross-sectional area of plating rack bus bars. However, tailoring the bus bars' geometry is difficult to implement in an actual rack due to the extra bus bar mass that is needed in the lower current regions to reduce the voltage drop between contacts and the design complexity this generates.

It would therefore be desirable to provide for improving the thickness distribution in electroplating.

SUMMARY OF INVENTION

The present invention provides for enhanced electroplating and particularly for improved plating thickness distribution. More particularly, the present invention relates to a method for electroplating one article which comprises providing a resistor between an electrically conductive bus bar and the at least one article to be electroplated. The ratio of the resistance of the resistor to the bus bar resistance between at least two workpiece contact points is at least about 10:1. An electroplating composition is provided in contact with the at least one article to be plated, and a plating current is applied to plate the at least one article.

Another aspect of the present invention relates to electroplating apparatus which comprises a plating tank comprising an electrically conductive bus bar, rack for at least one article to be plated, a resistor located between the bus bar and rack, and a source for supplying current to the plating tank. The ratio of the resistance of the resistor to the bus bar resistance between at least two workpiece contact points is at least about 10:1.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

For a better understanding of the present invention, together with other and further objects, advantages and capabilities thereof, reference is made to the following disclosure and the appended claims in connection with the above-described drawings.

For illustrative purposes only, reference is made to the electroplating arrangement disclosed in U.S. patent application Ser. No. 09/178,084 filed Oct. 23, 1998, now Pat. No. 6,176,985, as modified pursuant to the present invention. The entire disclosure of U.S. Ser. No. 09/178,084 is incorporated herein by reference. However it being understood that other electroplating apparatus can be modified pursuant to the present invention.

Figure 3:
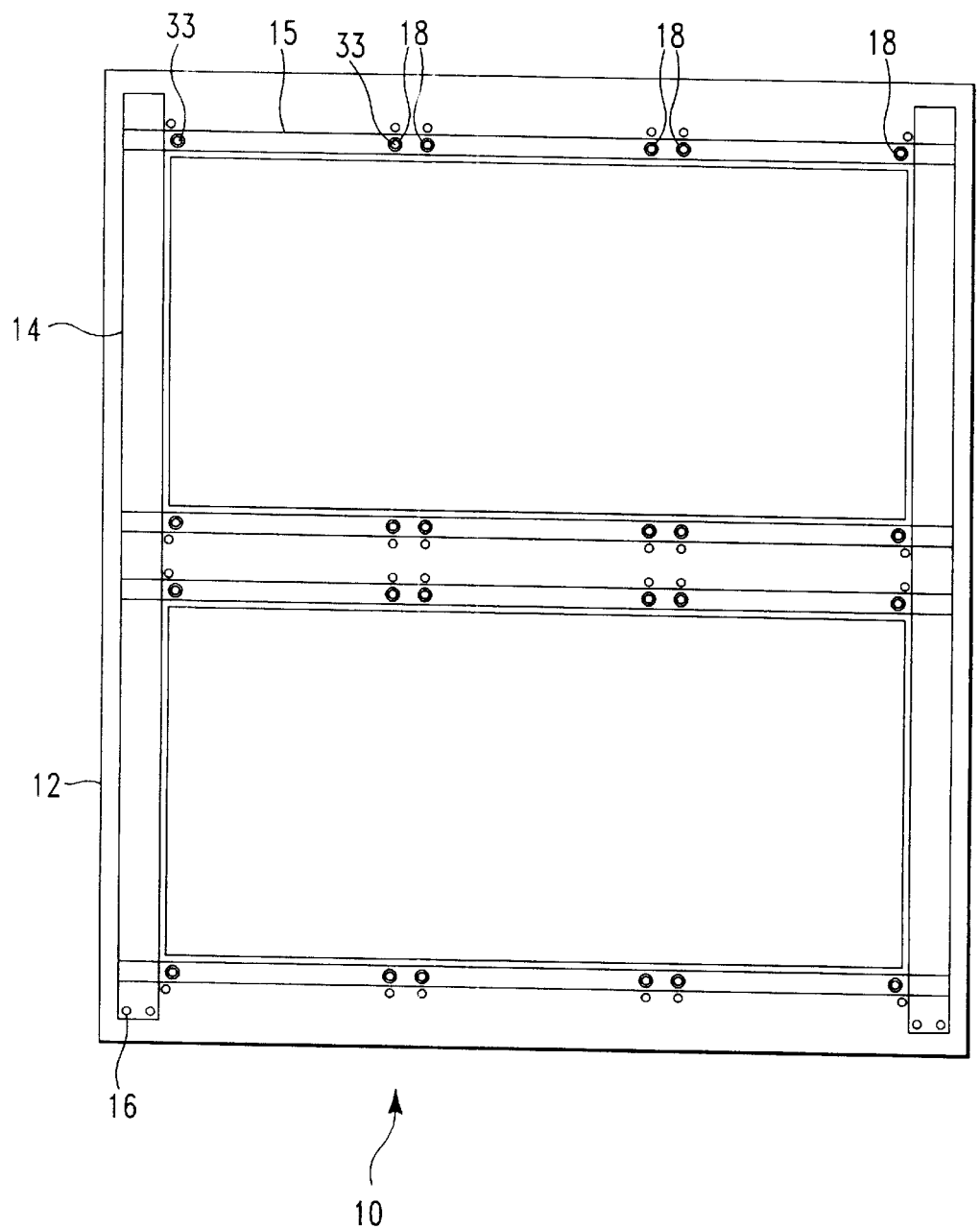
FIG. 3 illustrates an example of a plating rack that can be employed in the present invention.

In FIG. 3 there is shown a supporting structure 10 having an electrically insulated surface 12 and an electrically conductive core 14 and 15 forming horizontal and vertical conductive members, respectively. The electrically conductive core 14 and 15 may be any electrically conductive material but is typically a metal material and more typically made of copper. The electrically insulative surface 12 may be any electrically insulative material but is typically a material known in the printed circuit industry as epoxyglass. Epoxy-glass is a material made by impregnating a woven fabric or non-woven layer of fiber glass cloth fibers with an epoxy resin material and curing or partially curing the impregnated composite. Laminating provides a smooth surface which is desirable for solution transport across the surface during plating. This material may then be laminated in layers including laminating around a copper or other electrically conductive material core. The electrically conductive core may include a solid, stranded, laminar, filled or similarly conductive structure to form the conductive members. The supporting structure 10 has at least two openings, 16 and 18 which expose at least two areas of the electrically conductive core. A plating current source contact is attached to a first of the openings 16 as shown in FIG. 3. A second contact for providing an electrical connection to a workpiece is attached through a second opening for example 18. There may be a plurality of these contacts for making electrical connection to a workpiece and/or plurality of workpieces.

In a preferred arrangement, the plating rack is capable of accommodating multiple flexible circuits that each contain multiple parts. The flex circuits were arranged in rows. The power conductive members (15, 14, respectively) ran vertically at each edge of the rack and horizontally above and below each row of parts, per the referenced disclosure. Contacts from the conductive members to the flexible circuits are positioned along the edge of the circuits section, two contacts per edge for a total of six contacts per horizontal conductive member.

During the electrical modeling of this structure a disparity in plating current was found between the contact located at the junction of the top most horizontal conductive member to vertical conductive member contact position and the center circuit section on the bottom horizontal conductive member. More current was passing through the top horizontal conductive member contacts than the bottom horizontal conductive member. Since the plating thickness is a function of the amount of electrical charge passed, the plating thickness in the locations of higher current flow will be thicker. This is so even though the core 14, 15 is preferably of sufficient size to provide substantially resistance free conduction of high plating currents for reducing plating non-uniformity when using a plurality of second openings 18. The conductive members 14, 15 are preferably of sufficient size to provide substantially resistance-free conduction of high plating currents, similar to conductive members used in other portions of an electroplating system.

Figure 4A:
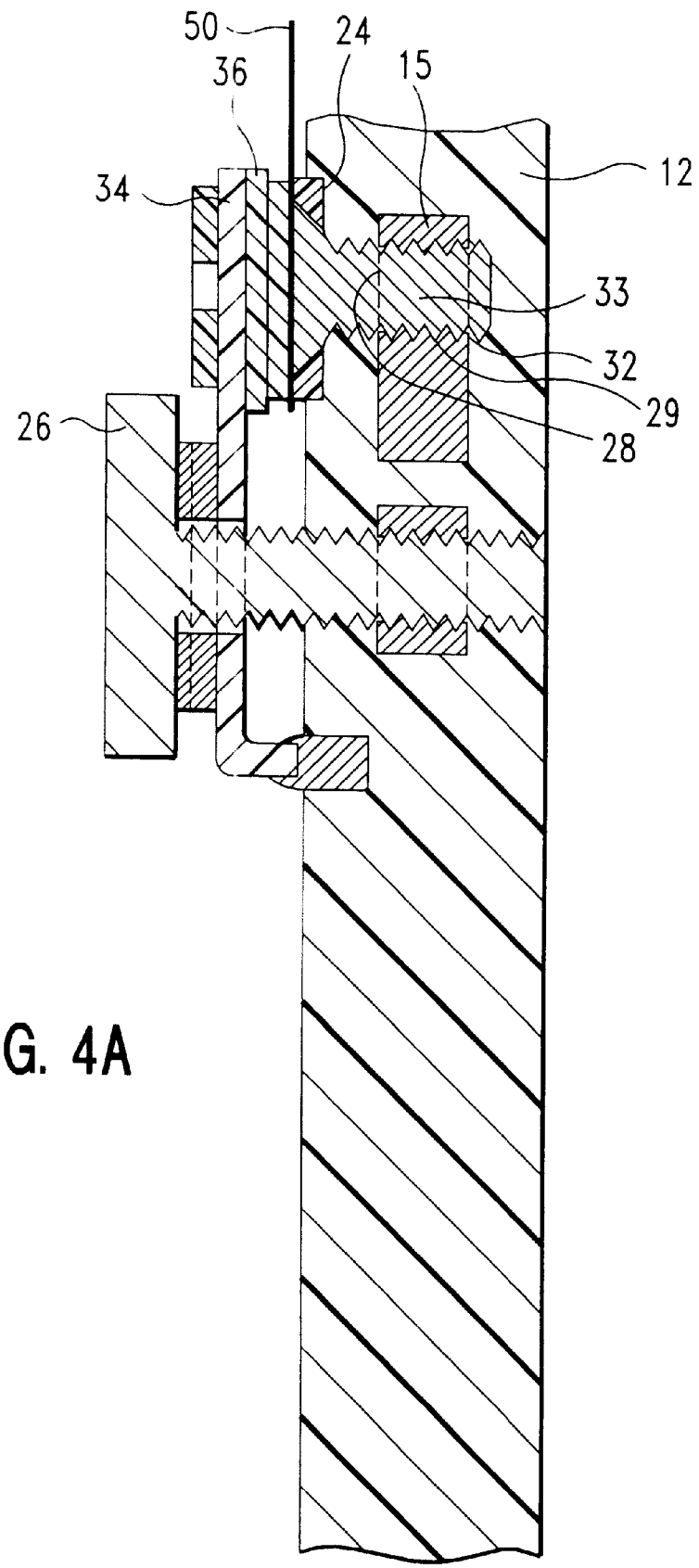
FIGS. 4A and 4B show a structure for contacting a workpiece in the assembled and opened or exploded views respectively.
Figure 4B:
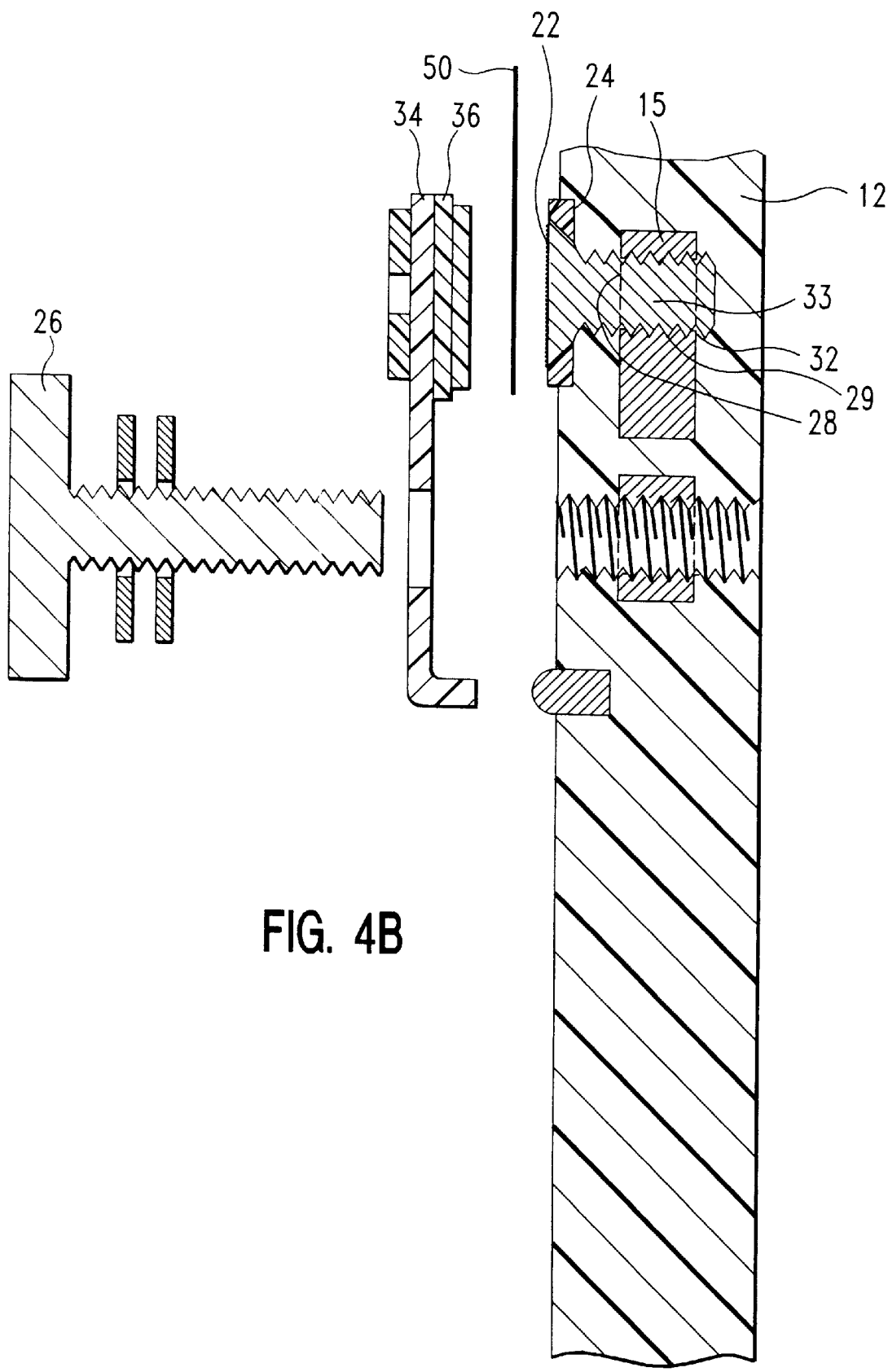

Shown in FIGS. 4A and 4B are a second contact structure. In FIG. 4A, the structure is shown assembled to a workpiece 50 and in FIG. 4B the structure is shown in an exploded view to make the individual components more visible. As shown in FIG. 4A the supporting structure 10 and core 15 with insulative surface 12 has an opening 18 exposing an area 29 of core 15. An electrical contact 33 is positioned such as to make a first electrical contact with workpiece 50, and a second electrical contact 32 is provided to make electrical contact with 15 through area 29.

Workpiece 50 may be a circuitized or uncircuitized substrate, a circuit board, or any other object on which one wishes to add or remove material by electroplating including noble metal plating and/or adding dendrites. Electrical contact 33 may have dendrites or other engineered surface treatments on its surface 22 for better electrical contact where it comes in contact with workpiece 50 as shown in FIG. 4B. Electrically insulative gasket 24 is positioned about contact 33 and provides a seal to prevent electroplating fluid from contacting it when the contact 33 is making electrical connection to the workpiece 50. Various methods are possible for bringing the electrical contact 33 into electrical connection with workpiece 50. For example, various spring arrangements or a thumb screw arrangement 26 as shown in FIG. 4A can be used with a spring member 34 and a resilient material 36 to assist in holding workpiece 50 in contact with electrical contact 32. Thumb screw arrangement 26 or other means for affecting the normal force contact between contact 33 and workpiece 50 would typically be electrically isolated from conducting cores 14 and 15. Insulative gasket 24 may be made of any electrically insulative material but is preferably an elastomer material such as VITON™ and is preferably in contact with workpiece 50 and contact 33 as shown in FIG. 4A. VITON is a trademark of E.I. du Pont de Nemours & Co., Inc. The insulative gasket may also be made inflatable as a way to bring it into contact with contact 33 and workpiece 50.

In accordance with the present invention, a resistor is provided between electrical conductive members 14, 15 and the workpiece 50. In the arrangement disclosed herein, electrical contact 33 can act as the resistor, also referred to herein as the dropping resistance. In previous arrangements, the size of electrical contacts to the workpiece was maximized and the material resistivity was minimized believing a minimum total resistance between the workpiece and power distribution would provide the most uniform plating.

In accordance with the present invention, the ratio of the dropping resistance to the conductive member resistance is typically at least 10:1, more typically about 10:1 to about 50:1 and preferably about 20:1 to about 40:1. The conductive member resistance is the maximum resistance from one second contact 32 (see FIGS. 4A and 4B) to another second contact 32 which are positioned within openings 18 of FIG. 3. The resistance of the resistor 33 is determined by the resistivity of the material used and its dimensions. The electrical resistance of a conductor of uniform cross-section is the resistivity of the material multiplied by the conductor length divided by the cross-sectional area using consistent units. Resistors 33 are typically made of copper, brass, titanium, nickel and stainless steel. Copper has a resistivity of about $1.8\ E^{-8}$ ohm meters, brass has a resistivity of about $18\ E^{-8}$ ohm meters, titanium has a resistivity of about $42\ E^{-8}$ ohm meters and stainless steel has a resistivity in the range of $50$–$70\ E^{-8}$ ohm meters. Accordingly, use of a material having a higher resistivity can provide a higher resistance using the same physical dimensions as a lower resistivity material. Maintaining the physical size of the electrical contact 33 by increasing the material resistivity instead of the physical size of the contacts makes it possible to use existing plating equipment while implementing the present invention.

It is preferred that the material employed have a resistivity of at least about $15\ E^{-8}$ ohm meters and more preferably at least about $20\ E^{-8}$ ohm meters. Preferred materials include brass, titanium and stainless steel and more preferably titanium due to its resistivity and being generally chemically inert in the plating baths employed. In addition, the resistor is preferably relatively inert in the plating process. The addition of these dropping resistors does not actually use additional electrical power of the plating process because the plating baths are normally heated, the relatively small amount of power dissipated by the resistors of the present invention will contribute to the bath heating replacing electrical power consumed by the heaters. Since the power dissipated by the dropping resistors are proportional to the current passed, this can be accounted for when setting up a new part or changing the part plating thickness by adjusting the plating parameters.

Figure 1:
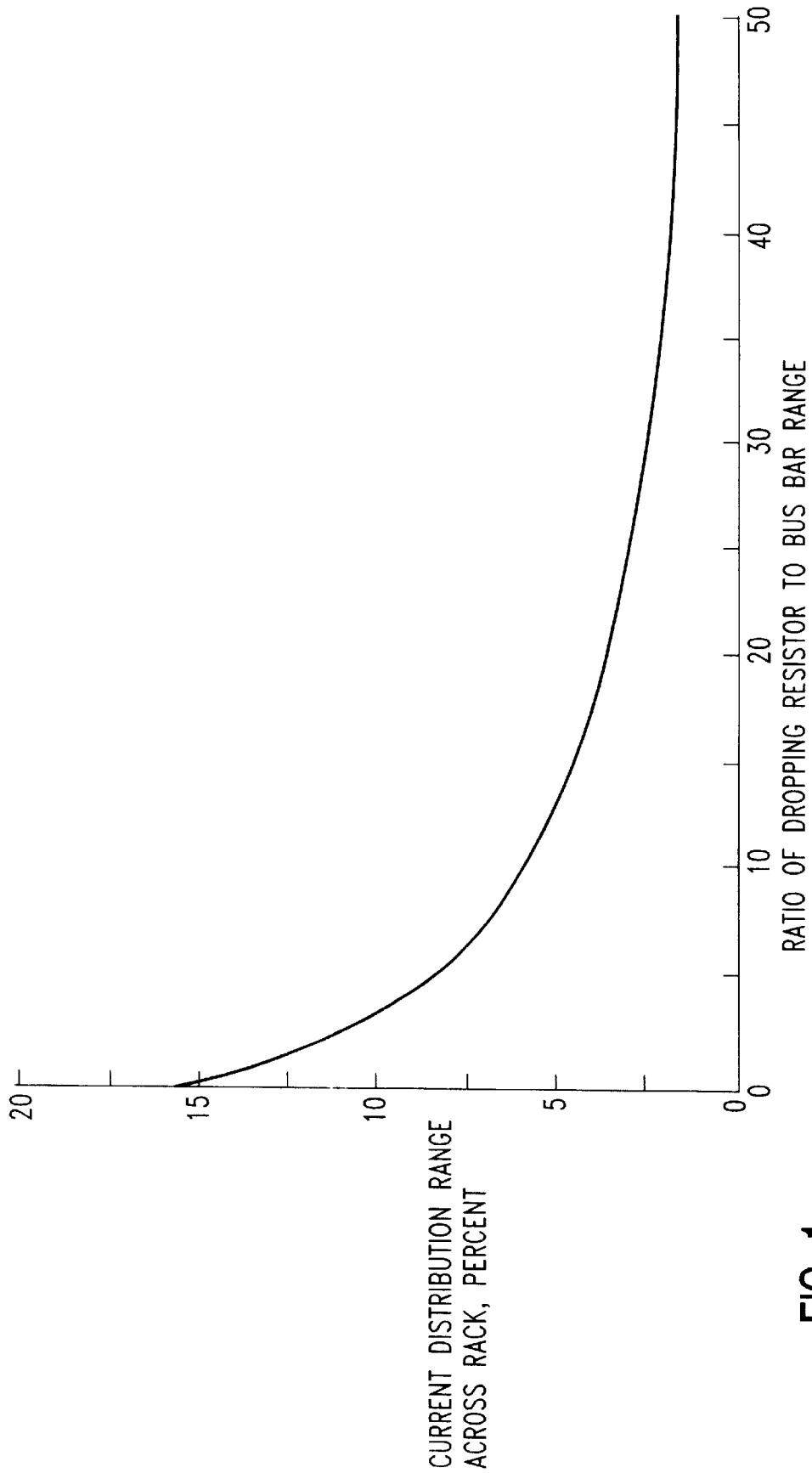
FIGS. 1 and 2 are grafts of a current distribution range v. ratio of resistance of resistor to bus bar.
Figure 2:
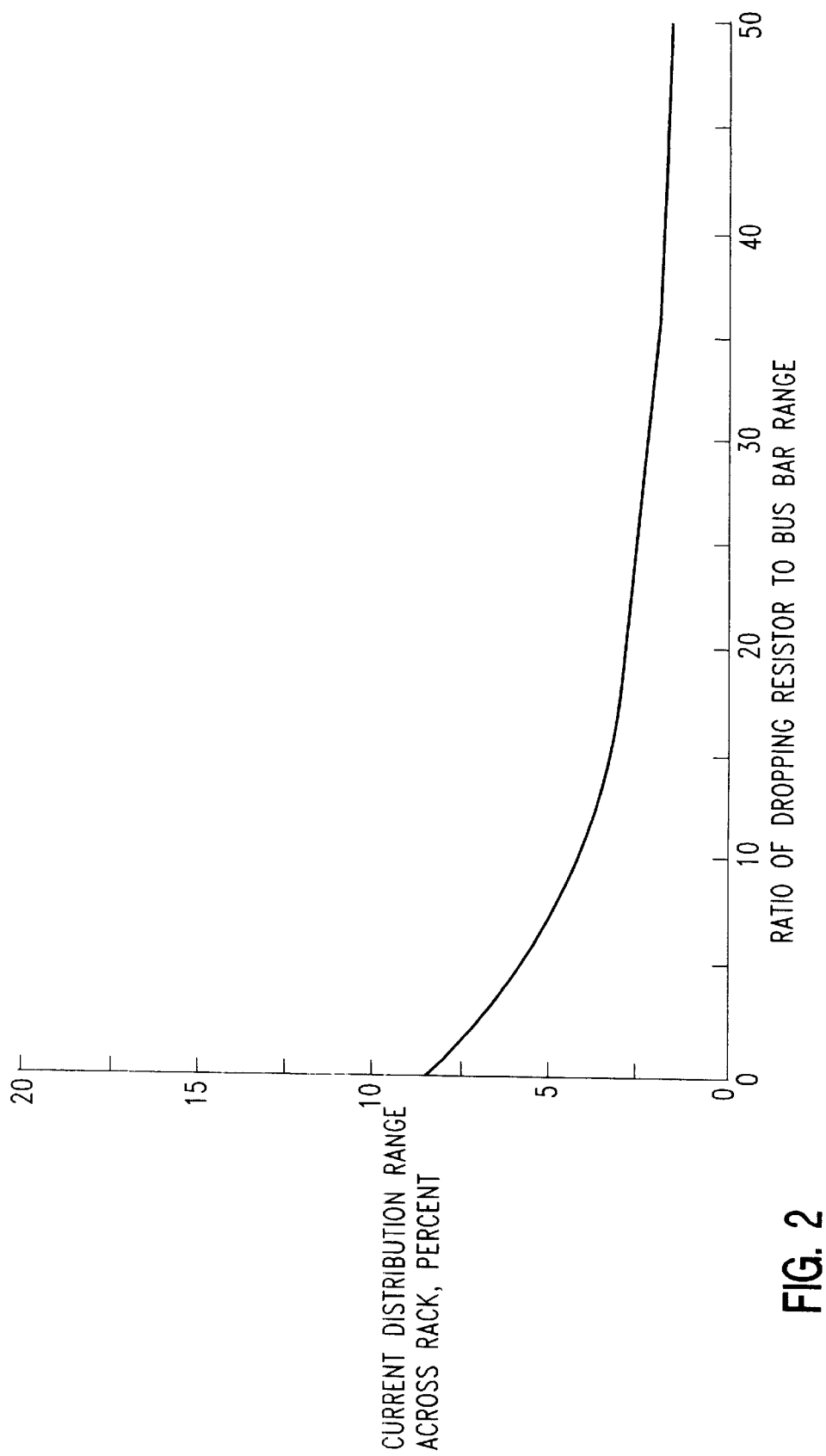

FIGS. 1 and 2 are graphs for two different plating racks illustrating current distribution range across the rack in percent versus ratio of dropping resistor to bus bar. In FIG. 1, the vertical conductive members have cross-sections of 1.5 by 1 inch and horizontal conductive members of 0.3 inch by 1 inch. In FIG. 2, the vertical conductive members have cross-sections of 1.5 by 1 inch and horizontal conductive members of 1.5 inch by 1 inch. As illustrated in FIGS. 1 and 2, the ratio of dropping resistor to conductive member resistances is typically at least about 10:1 to provide distribution range across the plating rack. In particular, the inherent current non-uniformity for the design analyzed can be as high as 15% without dropping resistors or be reduced to less than 1% depending on the magnitude of the dropping resistor.

FIGS. 1 and 2 show the effect of this dropping resistor on the plating current ratio across the plating rack and workpieces mounted thereon, that a dropping resistor of only milli-ohms can be used to reduce the plating current variation to less than 1%. This reduces the inherent portion of the plating thickness variation and allows more of the tolerance range for other forms of thickness variations.

By way of example, if a current limiting or dropping resistance were calculated by current suggestions in the art in a plating system delivering 60 amps at 3 volts for 30 workpieces, the desired resistance would be 667 milli-ohms. On the other hand, calculating the resistance by the present invention would provide a dropping resistance of 20 milli-ohms. Since power consumption is linear to resistance, this would represent a 33 times reduction in power consumption.

According to current suggestions in the art, as workpieces become smaller, the limiting or dropping resistance increases. In the present invention, the dropping resistance would be constant, thereby improving over the prior art.

Figure 5:
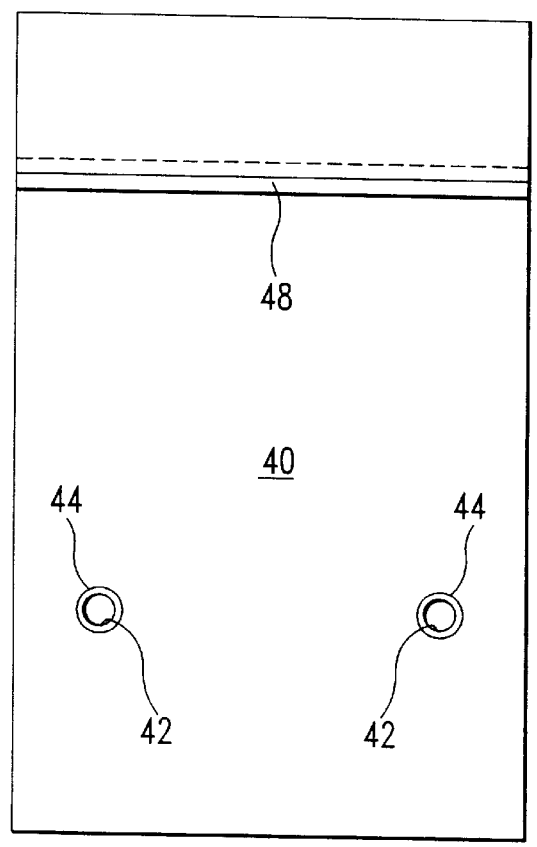
FIG. 5 shows a front view of a structure providing a contact to a high current electrical source.

Shown in FIG. 5 is a plating current source contact 40 shown in front view. Current source contact 40 has two holes 42 which may be drilled through or countersunk 44 as shown in FIG. 5. Current source contact 40 is normally attached preferably by bolting through holes 42, to first opening 16 of supporting structure 10 of FIG. 1. Other fastening arrangements which provide a solid electrical connection between first contact 40 and core 14 may be used.

Figure 6:
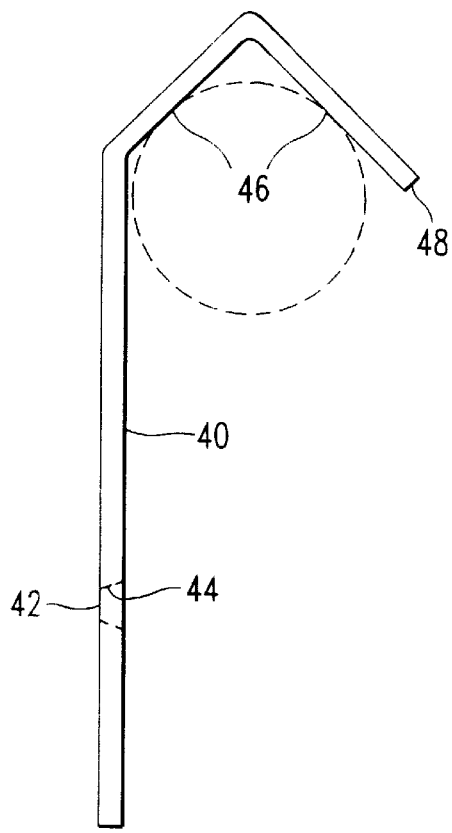
FIG. 6 shows a side view of the structure of FIG. 5.

Shown in FIG. 6 is a side view of the plating current source contact 40 shown in FIG. 5. Plating current source contact 40 is bent as shown in FIG. 6 and has end 48 positioned so that it can be placed over a round bar or other source of plating current. Plating current source contact 40 is typically made of copper, brass, or other copper alloy material, but can be made of any electrically conductive material, preferably a metal material.

In operation there are typically two plating source contacts 40 mounted at the upper left and upper right positions on supporting structure 10 of FIG. 3 arranged so that supporting structure 10 can be hung from a cylindrical bar as shown in the dotted position in FIG. 6. The cylindrical bar provides the source of electrical current.

Typically a plurality of electrical contacts 33 are attached to the conductive cores 14 and 15 by second contact 32 and are located in openings 18, two are shown in FIG. 3, located at various positions on supporting structure 10 about the peripheral area of workpiece 50. As mentioned, contact 33 may have dendrites on its surface where it comes in contact with workpiece 50.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for enhancing the electroplating of at least one article supported by an electrically conductive support structure adapted to conduct electrical current and having a plurality of electrical connections adapted to connect to at least one article to be electroplated which comprises providing a resistor between said electrically conductive support structure and the article to be electroplated at each of said plurality of electrical connections;

said resistors being electrically connected to said electrically conductive support structure at connection points;

the said electrically conductive support structure having an electrical resistance between any of said connection points and each of other of said connection points;

at least one resistance between a connection point and another connection point forming a maximum electrical resistance value between any two connection points on said electrically conductive support structure;

wherein the ratio of the resistance of said resistors to the maximum electrical resistance value between any two connection points on said electrically conductive support structure is at least about 10:1;

providing an electroplating composition in contact with the at least one article to be plated, and applying a plating current to thereby plate the at least one article.

2. The method of claim 1 wherein said ratio of the resistance is about 10:1 to about 50:1.

3. The method of claim 1 wherein said ratio of the resistance is about 20:1 to about 40:1.

4. The method of claim 1 wherein the resistivity of the resistors is at least about 15 $E^{-8}$ ohm meters.

5. The method of claim 1 wherein the resistivity of the resistors is at least about 20 $E^{-8}$ ohm meters.

6. The method of claim 1 wherein the resistors comprise at least one member selected from the group consisting of copper, brass, titanium and stainless steel.

7. The method of claim 1 wherein the resistors comprise at least one member selected from the group consisting of brass, titanium and stainless steel.

8. The method of claim 1 wherein the resistors comprise titanium.

9. The method of claim 1 wherein the resistors comprise stainless steel.

10. The method of claim 1 wherein the electroplating composition is a copper plating composition.

11. Electroplating apparatus which comprises a plating tank comprising an electrically conductive support rack for holding at least one article to be plated and for conducting electrical current, and having a plurality of electrical connections and a resistor located between said electrically conductive support rack and the article to be electroplated at each of said plurality of electrical connections;

said resistors being electrically connected to said electrically conductive support rack at connection points;

the said electrically conductive support rack having an electrical resistance between any of said connection points and each of other of said connection points;

at least one resistance between a connection point and another connection point forming a maximum electrical resistance value between any two connection points on said electrically conductive support rack;

wherein the ratio of the resistance of said resistors to the maximum electrical resistance value between any two connection points on said electrically conductive support rack is at least about 10:1, and a source for supplying current to the support rack.

12. The apparatus of claim 11 wherein said ratio of the resistance is about 10:1 to about 50:1.

13. The apparatus of claim 11 wherein said ratio of the resistance is about 20:1 to about 40:1.

14. The apparatus of claim 11 wherein the resistivity of the resistors is at least about 15 $E^{-8}$ ohm meters.

15. The apparatus of claim 11 wherein the resistivity of the resistors is at least about 20 $E^{-8}$ ohm meters.

16. The apparatus of claim 11 wherein the resistors comprise at least one member selected from the group consisting of copper, brass, titanium and stainless steel.

17. The apparatus of claim 11 wherein the resistors comprise at least one member selected from the group consisting of brass, titanium and stainless steel.

18. The apparatus of claim 11 wherein the resistors comprise titanium.

19. The apparatus of claim 11 wherein the resistors comprise stainless steel.

* * * * *

UNITED STATES PATENT AND TRADEMARK OFFICE
CERTIFICATE OF CORRECTION

PATENT NO.    : 6,267,860 B1
DATED         : July 31, 2001
INVENTOR(S)   : William L. Brodsky Page 1 of 1

It is certified that error appears in the above-identified patent and that said Letters Patent is hereby corrected as shown below:

<u>Column 4,</u>
Line 52, change "bus bar" to -- conductive member --.

Signed and Sealed this

Thirtieth Day of April, 2002

Attest:

Attesting Officer

JAMES E. ROGAN
Director of the United States Patent and Trademark Office